(12) United States Patent
Han et al.

(10) Patent No.: US 10,790,797 B2
(45) Date of Patent: Sep. 29, 2020

(54) ACOUSTIC RESONATOR AND METHOD OF MANUFACTURING THE SAME

(71) Applicant: Samsung Electro-Mechanics Co., Ltd., Suwon-si (KR)

(72) Inventors: Won Han, Suwon-si (KR); Moon Chul Lee, Suwon-si (KR); Jae Chang Lee, Suwon-si (KR); Sang Uk Son, Suwon-si (KR); Tae Hun Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 740 days.

(21) Appl. No.: 15/274,359

(22) Filed: Sep. 23, 2016

(65) Prior Publication Data

US 2017/0237409 A1 Aug. 17, 2017

(30) Foreign Application Priority Data

Feb. 17, 2016 (KR) .................. 10-2016-0018322

(51) Int. Cl.
*H03H 9/17* (2006.01)
*H03H 9/13* (2006.01)
*H01L 41/047* (2006.01)
*H01L 41/053* (2006.01)
*H03H 9/54* (2006.01)

(52) U.S. Cl.
CPC .............. *H03H 9/17* (2013.01); *H01L 41/047* (2013.01); *H01L 41/053* (2013.01); *H03H 9/13* (2013.01); *H03H 9/173* (2013.01); *H03H 9/54* (2013.01)

(58) Field of Classification Search
CPC ............................. H01L 41/047; H03H 9/17

USPC ................ 310/321, 320, 365–366, 324, 348
See application file for complete search history.

(56) References Cited

U.S. PATENT DOCUMENTS

| 7,602,101 | B2 | 10/2009 | Hara et al. |
| 8,248,185 | B2 | 8/2012 | Choy et al. |
| 10,298,197 | B2 * | 5/2019 | Lee .................. H03H 9/542 |

(Continued)

FOREIGN PATENT DOCUMENTS

| CN | 1685609 A | 10/2005 |
| CN | 101170303 A | 4/2008 |

(Continued)

OTHER PUBLICATIONS

Korean Office Action dated Dec. 19, 2016, in counterpart Korean Application No. 10-2016-0018322 (5 pages in English, 5 pages in Korean).

(Continued)

*Primary Examiner* — Thomas M Dougherty
*Assistant Examiner* — Karen B Addison
(74) *Attorney, Agent, or Firm* — NSIP Law

(57) ABSTRACT

An acoustic resonator includes: a substrate; a resonance part mounted on the substrate and including resonance part electrodes, the resonance part being configured to generate acoustic waves; a cavity disposed between the resonance part and the substrate; a frame part disposed on at least one electrode among the resonance part electrodes, and being configured to reflect the acoustic waves; and a connection electrode configured to connect the at least one electrode to an external electrode, and having a thickness less than a thickness of the at least one electrode.

16 Claims, 11 Drawing Sheets

(56) References Cited

U.S. PATENT DOCUMENTS

| | | | |
|---|---|---|---|
| 10,367,471 B2* | 7/2019 | Kim | H03H 9/131 |
| 2006/0071736 A1 | 4/2006 | Ruby et al. | |
| 2006/0226932 A1 | 10/2006 | Fazzio et al. | |
| 2008/0143215 A1 | 6/2008 | Hara et al. | |
| 2011/0298564 A1 | 12/2011 | Iwashita et al. | |
| 2012/0218060 A1 | 8/2012 | Burak et al. | |
| 2017/0237409 A1 | 8/2017 | Han et al. | |

FOREIGN PATENT DOCUMENTS

| | | |
|---|---|---|
| CN | 101217266 A | 7/2008 |
| CN | 102301590 A | 12/2011 |
| JP | 2008-109414 A | 5/2008 |
| JP | 2017-147719 A | 8/2017 |
| KR | 10-2006-0107323 A | 10/2006 |
| KR | 10-2006-0134866 A | 12/2006 |
| KR | 10-2008-0037546 A | 4/2008 |
| KR | 10-2011-0005232 A | 1/2011 |
| KR | 10-2011-0041749 A | 4/2011 |
| KR | 10-2013-0018399 A | 2/2013 |
| WO | WO 2004/030208 A2 | 4/2004 |
| WO | WO 2009/132011 A2 | 10/2009 |
| WO | WO 2010/095640 A1 | 8/2010 |

OTHER PUBLICATIONS

Japanese Office Action dated Nov. 28, 2017, in corresponding Japanese Application No. 2016-188028 (6 pages in English, 3 pages in Japanese).

Chinese Office Action dated Jan. 2, 2020 in counterpart Chinese Patent Application No. 201610915495.X (24 pages in English and 14 pages in Chinese).

Chinese Office Action dated May 25, 2020 issued in the corresponding Chinese Patent Application No. 201610915495.X (28 pages in English, 16 pages in Chinese).

* cited by examiner

ACOUSTIC RESONATOR AND METHOD OF MANUFACTURING THE SAME

CROSS-REFERENCE TO RELATED APPLICATIONS

This application claims benefit under 35 USC 119(a) of Korean Patent Application No. 10-2016-0018322 filed on Feb. 17, 2016 in the Korean Intellectual Property Office, the entire disclosure of which is incorporated herein by reference for all purposes.

BACKGROUND

1. Field

The following description relates to an acoustic resonator and a method of manufacturing an acoustic resonator.

2. Description of Related Art

Recently, in accordance with the rapid development of communications technology, there has been a demand for the development of improved signal processing technology and radio frequency (RF) component technology. In particular, in accordance with the trend towards miniaturization of wireless communications devices, there has been a demand for miniaturization of radio frequency components. A bulk acoustic wave (BAW) type filter using a semiconductor thin film wafer manufacturing technology is an example of such radio frequency components.

A bulk acoustic wave (BAW) resonator, which may be a key component for passing a desired frequency band in a radio frequency (RF) signal and blocking an undesired frequency band in the radio frequency (RF) signal, is a thin film type element configured to generate resonance using piezoelectric characteristics of a piezoelectric dielectric material deposited on a silicon wafer, a semiconductor substrate.

A bulk acoustic wave (BAW) resonator may be used in applications such as a small and light filter, an oscillator, a resonance element, an acoustic resonance mass sensor, and the like, of a mobile communications device, a chemical device, a bio device, or the like.

In accordance with the demand for improved signal processing technology and radio frequency (RF) component technology, and the trend towards miniaturization of radio frequency components, technologies for preventing loss of resonance energy in bulk acoustic wave (BAW) resonators are desirable.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an acoustic resonator includes: a substrate; a resonance part mounted on the substrate and including resonance part electrodes, the resonance part being configured to generate acoustic waves; a cavity disposed between the resonance part and the substrate; a frame part disposed on at least one electrode among the resonance part electrodes, and being configured to reflect the acoustic waves; and a connection electrode configured to connect the at least one electrode to an external electrode, and having a thickness less than a thickness of the at least one electrode.

The thickness of the connection electrode may be less than half of the thickness of the at least one electrode.

The thickness of the connection electrode may be greater than 1,000 Å.

The frame part may have a symmetrical shape in an area on the at least one electrode corresponding to the cavity.

The frame part may have a continuous shape along a circumference of an area on the at least one electrode corresponding to the cavity.

The frame part may protrude from the at least one electrode along a circumference of an area on the at least one electrode corresponding to the cavity.

The frame part may be formed of a material having a property different from a property of the at least one electrode.

The frame part may be formed of a material that is same as a material of the at least one electrode, and that is caused to have a property different from a property of the at least one electrode. The frame part may be disposed along a circumference of an area of the at least one electrode corresponding to the cavity.

The resonance may further include a piezoelectric body. The resonance part electrodes may include a first electrode disposed on the substrate so as to form the cavity between the first electrode and the substrate, and contacting a first surface of the piezoelectric body, and a second electrode contacting a second surface of the piezoelectric body and having the frame part disposed thereon.

In another general aspect, a method of manufacturing an acoustic resonator includes: forming a resonance part on a substrate, the resonance part including resonance part electrodes; forming a sacrificial layer between the resonance part and the substrate; forming a frame part on at least one electrode among the resonance part electrodes; forming a connection electrode configured to connect the at least one electrode to an external electrode, the connection electrode including a thickness less than a thickness of the at least one electrode; and forming a cavity by removing the sacrificial layer.

The forming of the connection electrode may include: forming a connection layer, simultaneously with forming the at least one electrode, to be connected to the at least one electrode; and etching the connection layer at the thickness less than the thickness of the at least one electrode.

The at least one electrode may be disposed in an area corresponding to the cavity. The forming of the connection electrode may include depositing a material of the connection electrode at a constant thickness up to an area to be connected to the external electrode, and to cover the at least one electrode.

The at least one electrode may be disposed in an area corresponding to the cavity; and the forming of the connection electrode may include depositing a material of the connection electrode, which is different than a material of the at least one electrode, to be connected to the at least one electrode.

The forming of the frame part may include forming the frame part to have a symmetrical shape on the at least one electrode.

In another general aspect, an acoustic resonator includes: a substrate; a resonance part mounted on the substrate, the resonance part including resonance part electrodes and a piezoelectric body configured to generate acoustic waves; a cavity disposed between the resonance part and the substrate; a frame part disposed on a first electrode among the resonance part electrodes, at an outer circumference of the first electrode with respect to extents of the cavity, and being configured to reflect the acoustic waves; and a connection electrode connected to the at least one electrode and configured to be connected to an external electrode, the connection electrode having a thickness less than a thickness of the first electrode.

The frame part may protrude from the first electrode in a thickness direction of the acoustic resonator.

The frame part may have an annular shape.

A density or an elastic modulus of a material of the frame part may be different than a density or an elastic modulus, respectively, of a material of the first electrode.

In another general aspect, an acoustic resonator includes: a substrate; a resonance part mounted on the substrate and including resonance part electrodes, the resonance part being configured to generate acoustic waves; a cavity disposed between the resonance part and the substrate; a frame part disposed on at least one electrode among the resonance part electrodes, and being configured to reflect the acoustic waves; and a connection electrode configured to connect the at least one electrode to an external electrode, the connection electrode including a thickness less than half of a thickness of the first electrode and at least 1,000 Å.

The connection electrode may include a material that is different than a material of the at least one electrode.

A density or an elastic modulus of a material of the frame part may be different than a density or an elastic modulus, respectively, of a material of the first electrode.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
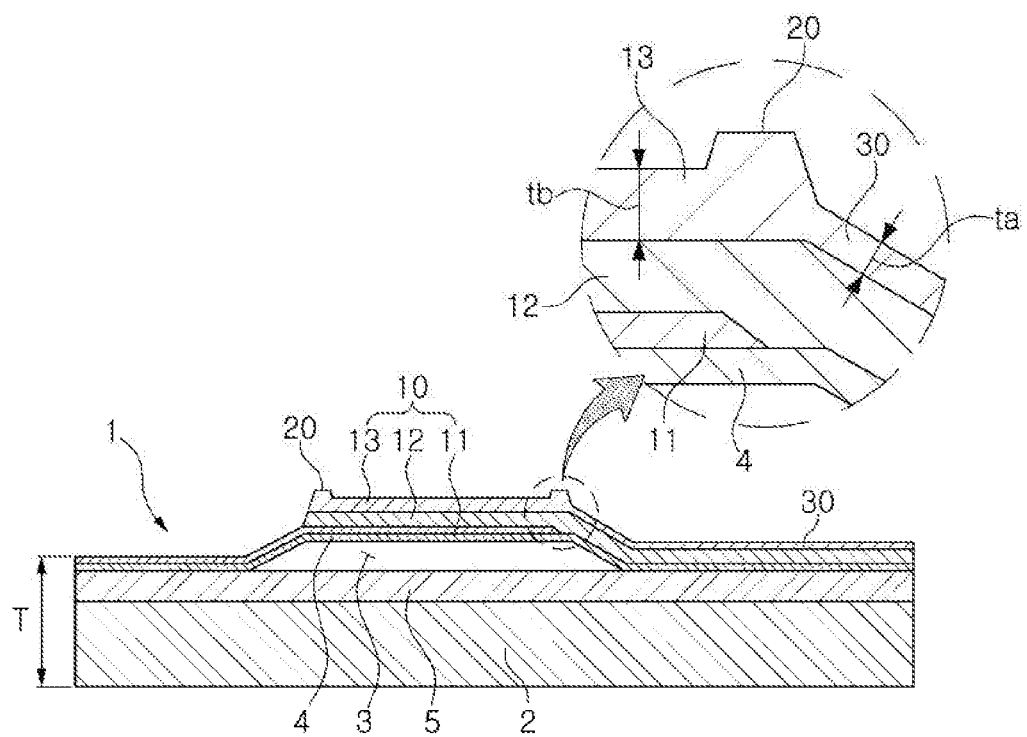
FIG. 1 is a cross-sectional view illustrating an acoustic resonator, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

The disclosure relates to an acoustic resonator and a method of manufacturing an acoustic resonator. For example, one or more embodiments of the disclosure relate to a technology in which a connection electrode is formed in an acoustic resonator to include a portion having a thickness that is less than a thickness of an electrode of a resonance part of the acoustic resonator on which a frame part of the acoustic resonator is formed, thereby providing increased symmetry to the frame part, compared to typical acoustic resonators where such a frame part is asymmetric or becomes more asymmetric due to the same or increased thickness of the connection electrode relative to the resonance part in a typical acoustic resonator. As a result of such an improved configuration with the connection electrode having a thickness less than the electrode of the resonance part, loss of resonant acoustic waves reflected by a frame part of an acoustic resonator according to one or more embodiments may be decreased compared to typical acoustic resonators, and thus result in improved performance over typical acoustic resonators.

Accordingly, in one or more embodiments, the connection electrode is formed to have a thin thickness, as described above, to prevent, minimize, or mitigate loss of resonance energy generated in the resonance part. More specifically, when a quality factor (QF) of an acoustic resonator such as a bulk acoustic wave (BAW) resonator, or the like having such an improved configuration, has an accordingly improved quality factor (QF) over typical acoustic resonators, frequency band selection characteristics of filters using the acoustic resonator according to one or more embodiments may be improved over frequency band selection characteristics of typical acoustic resonator applications, and insertion loss and attenuation performance of the filters may be improved over insertion loss and attenuation performances of typical filters reliant on typical acoustic resonators. In addition, in one or more embodiments, the frame part may be formed on the resonance part of the acoustic resonator and may be designed to confine the resonance energy to an active area of the acoustic resonator to improve the quality factor (QF) of the acoustic resonator. As an example, the frame part may be formed along a circumference of an acoustic resonator according to one or more embodiments to prevent loss of the resonance energy, thereby preventing deterioration of the quality factor of the acoustic resonator. The frame part 20 may be formed to have a symmetrical shape to improve prevention of the loss of resonance energy.

In addition, in one or more embodiments, a connection electrode may be provided in the resonance part for connection to an external electrode. However, as noted above, in a typical acoustic resonator the connection electrode may be a factor in damaging symmetry, or increasing asymmetry, of the frame part, and thus, the connection electrode may deteriorate a quality factor of the acoustic resonator.

However, in the disclosure herein and according to one or more embodiments, a connection electrode may be formed to have a thickness that is less than a thickness of an electrode of a resonance part of the acoustic resonator, thereby preventing, minimizing, or mitigating effects of the connection electrode on symmetry of the frame part.

FIG. 1 is a cross-sectional view illustrating an acoustic resonator 1, according to an embodiment. The acoustic resonator 1 includes, for example, a substrate 2, a resonance part 10 forming a recess or cavity 3 between the resonance part 10 and the substrate 2 and configured to generate acoustic waves, a frame part 20 formed on at least one electrode (e.g., a first electrode 11 or a second electrode 13, depending on arrangement and formation of a connection electrode 30) of the resonance part 10 and configured to reflect the acoustic waves, and the connection electrode 30 configured to connect the electrode 11 or 13 of the resonance part 10 on which the frame part 20 is provided to an external electrode.

The connection electrode 30 may have a thickness to that is less a thickness tb of the electrode 11 or 13 of the resonance part 10 on which the frame part 20 is formed, whereby an influence or potential of the connection electrode 30 to reduce a symmetry of the frame part 20 may be decreased. The connection electrode 30 may include a first portion that is inclined with respect to a mounting surface (e.g., the upper surface) of the substrate 2 and connected to the electrode 11 or 13 on which the frame part 20 is formed, and a second portion that is connected to the first portion and extends parallel to the mounting surface of the substrate portion 2. The second portion of the connection electrode 30 may be connected to the external electrode.

The resonance part 10 may function to generate acoustic waves (or vibrational energy) by vibrations. To this end, the resonance part 10 may include the first electrode 11, a piezoelectric body 12, the second electrode 13, and the like. In an example, the resonance part 10 may include substantially flat, non-inclined portions of the first electrode 11, the piezoelectric body 12, and the second electrode 13 that extend parallel to the mounting surface of the substrate 2.

The substrate 2, on which the resonance part 10 is provided, may be a silicon substrate or a silicon-on-insulator (SOI) type substrate, for example. The first electrode 11 may be formed on the substrate 2, and the recess 3 may be formed between the substrate 2 and the first electrode 11. In addition, the recess 3 may be formed such that the first electrode 11 and the substrate 2 are at least partially spaced apart from each other.

A membrane layer 4 may be formed on one surface of the first electrode 11 facing the substrate 2. The membrane layer 4 may be provided so that acoustic waves generated in the piezoelectric body 12 are not affected by the substrate 2.

A stop layer 5 functioning as an etching stopper may be formed on the substrate 2 (e.g., on the mounting surface of the substrate 2, between the substrate 2 and the first electrode 11) in order to protect the substrate 2. The stop layer 5 may contain silicon oxide ($SiO_x$), silicon nitride ($SiN_x$), or the like. However, these materials are merely examples, and other suitable materials may be used in the stop layer 5.

In addition, the recess 3 may be disposed between the resonance part 10 and the substrate 2, whereby reflection characteristics of the acoustic waves generated in the resonance part 10 may be improved. In other words, since the recess 3, which may be an empty space, has an impedance close to infinity, the acoustic waves may remain in the resonance part 10 without being lost. Therefore, loss of the acoustic waves of the resonance part 10 in a longitudinal direction, or the illustrated vertical direction, may be significantly decreased by the recess 3, whereby a quality factor (QF) of the resonance part 10 may be improved.

In addition, the first electrode 11, the second electrode 13, and the piezoelectric body 12 that are included in the resonance part 10 may be stacked on the substrate 2 in a sequence of the first electrode 11, the piezoelectric body 12, and the second electrode 13. Therefore, the piezoelectric body 12 may be disposed between the first electrode 11 and the second electrode 13. For example, the piezoelectric body 12 may be disposed directly between the first electrode 11 and the second electrode 13.

In other words, the resonance part 10 of the acoustic resonator 1, according to an embodiment, may include the first electrode 11 provided on the substrate 2 so as to form the recess 3 between the first electrode 11 and the substrate 2, the piezoelectric body 12 having one surface contacting the first electrode 11, and the second electrode 13 contacting the other surface of the piezoelectric body 12 and having the frame part 20 provided on the second electrode 13.

The resonance part 10 may resonate the piezoelectric body 12 depending on an electrical signal applied to the first electrode 11 and/or the second electrode 13 to generate a resonance frequency and a semi-resonance frequency.

The first electrode 11 and the second electrode 13 may be formed of metals such as gold (Au), molybdenum (Mo), ruthenium (Ru), aluminum (Al), platinum (Pt), titanium (Ti), tungsten (W), palladium (Pd), chromium (Cr), nickel (Ni), iridium (Ir), and the like. However, these materials are merely examples, and other suitable and/or different materials may be respectively used in the first and second electrodes 11 and 13.

In addition, the resonance part 10 may use the acoustic waves of the piezoelectric body 12. For example, when the signal is applied to the first electrode 11 and/or the second electrode 13, the piezoelectric body 12 may generate mechanical vibrations in the longitudinal direction (or the illustrated vertical or thickness direction T) of the acoustic resonator 1 to generate the acoustic waves.

The piezoelectric body 12 may be formed of materials such as zinc oxide (ZnO), aluminum nitride (AlN), silicon dioxide ($SiO_2$), doped zinc oxide (for example, W—ZnO), doped aluminum nitride (for example, Sc—AlN, MgZr—AlN, Cr—AlN, Er—AlN, Y—AlN), and the like. However, these materials are merely examples, and other suitable and/or multiple materials may be used in the piezoelectric body 12.

A resonance phenomenon of the piezoelectric body 12 may be generated when ½ of a wavelength of the applied signal coincides with a thickness of the piezoelectric body 12. In addition, when the resonance phenomenon is generated, electrical impedance may rapidly change. Therefore, the acoustic resonator 1, according to an embodiment, may be used as a filter for a select resonance frequency.

The resonance frequency may be determined by the thickness of the piezoelectric body 12, the structure and configuration of first and second electrodes 11 and 13 enclosing the piezoelectric body 12, a unique elastic wave velocity of the piezoelectric body 12, and the like. As an example, the resonance frequency may increase as the thickness of the piezoelectric body 12 is decreased, and the resonance frequency may decrease as the thickness of the piezoelectric body 12 is increased. Additionally, when the piezoelectric body 12 is configured to be disposed only within the resonance part 10, leakage of the acoustic waves formed by the piezoelectric body 12 to the outside of the resonance part 10 may be significantly decreased compared to typical acoustic resonators in which piezoelectric elements extend beyond such a resonance part.

In addition, the resonance part 10 may further include a protection layer. The protection layer may cover an outer surface of the second electrode 13, e.g., opposite the arrangement of the piezoelectric body 12, to serve to prevent the second electrode 13 from being exposed to an external environment.

In addition, depending on embodiments, either the first electrode 11 or the second electrode 13 may be formed to be connected to the connection electrode 30, which is extended outwardly of or beyond the piezoelectric body 12 to thereby be connected to connection parts and external electrodes. The connection parts may serve to confirm characteristics of the acoustic resonator 1 and the filter and perform required frequency trimming. In addition, the external electrodes may function to allow the resonance part 10 to apply a voltage to the piezoelectric body 12.

The frame part 20 may function to prevent the acoustic waves generated in the resonance part 10 from being lost. In more detail, the frame part 20 may function to reflect the acoustic waves in order to prevent loss, in a transverse direction (or an illustrated horizontal or length direction perpendicular to the thickness direction T), of the acoustic waves generated in the resonance part 10.

When the acoustic waves generated in the resonance part 10 are transferred to the frame part 20, the frame part 20 may reflect the acoustic waves inward to an inner portion of the resonance part 10 to prevent loss of the acoustic waves due to leakage of the acoustic waves to the outside. To this end, the frame part 20 may be provided on at least one of the electrodes of the resonance part 10. For example, the frame part 20 may be provided on the second electrode 13. In addition, the frame part 20 may be provided in a protruding shape on the electrode 13, for example, in order to reflect the acoustic waves generated in the resonance part 10. More specifically, for example, the frame part 20 may protrude in the illustrated vertical or thickness direction from the electrode 13 on which the frame part 20 is mounted, and thus may have a different (e.g., greater) height in the thickness direction than the electrode 13.

The frame part 20, according to an embodiment, may be provided in a protruding shape along a circumference of an area corresponding to (e.g., above) the recess 3. That is, the frame part 20 may be disposed within or along an outer circumference of the recess 3 in the directions transverse to the thickness direction T. More specifically, the frame part 20 may be disposed along or adjacent to an outer circumference of the resonance part 10.

As described above, the frame part 20 may be provided in a protruding shape on the example electrode 13 of the resonance part 10 to reflect the acoustic waves. The reason is that a transfer environment of the acoustic waves, which are elastic waves, for thicker portions of the example electrode 13 that includes the frame part 20 is different from a transfer environment of the acoustic waves in the remaining, thinner portions of the example electrode 13 of the resonance part 10.

The frame part 20 may have a symmetrical shape on the example electrode 13 to improve prevention of the loss of the acoustic waves. In other words, the frame part 20, according to an embodiment, may be provided to be symmetrical in, or with respect to, the area on the electrode 13 corresponding to the recess 3. The reason why the symmetrical configuration of the frame part 20 improves prevention of loss of the acoustic waves over typical acoustic resonators will be described below.

The acoustic waves reflected from one side of the frame part 20 may have characteristics changed while being reflected from the one side of the frame part 20. In a case in which the acoustic waves having the characteristics changed as described above are re-reflected from the other side (e.g., an opposite side) of the frame part 20, when the other side of the frame part 20 has a shape symmetrical to the shape of the one side of the frame part 20, the acoustic waves reflected from the one side of the frame part 20 are exposed to the same acoustic wave transfer condition, whereby loss of the acoustic waves is substantially prevented when the acoustic waves are reflected from the other side of the frame part 20. In addition, the frame part 20 may be continuously formed along the circumference of the area corresponding to the recess 3 to prevent the loss of the acoustic waves generated in the resonance part 10, which will be described below in detail with reference to FIG. 2.

In another embodiment, the frame part 20 may be formed of a material having a property different from a material of the electrode 11 or 13, depending on the arrangements of the electrodes 11 and 13, on which the frame part 20 is formed, or may be reformed to have a property different from that of the electrode 11 or 13, thereby reflecting the acoustic waves. This configuration will be described below in detail with reference to FIG. 3.

The connection electrode 30 may serve to connect the electrode 11 or 13, depending on the arrangements of the electrodes 11 and 13, on which the frame part 20 is formed and the external electrode to each other. In particular, the connection electrode 30 connected to the example electrode 13 on which the frame part 20 is formed may have a thickness that is less than a thickness of the example electrode 13. The purpose of this may be to prevent, minimize, or mitigate asymmetry of the frame part 20 as much as possible. In other words, the connection electrode 30 may be formed at the thickness less than the thickness of the electrode 11 or 13 on which the frame part 20 is formed in order to maintain the symmetry between the electrode 11 or 13 on which the frame part 20 is formed and the frame part 20, and thereby improve transfer characteristics of the acoustic waves.

Figure 10:
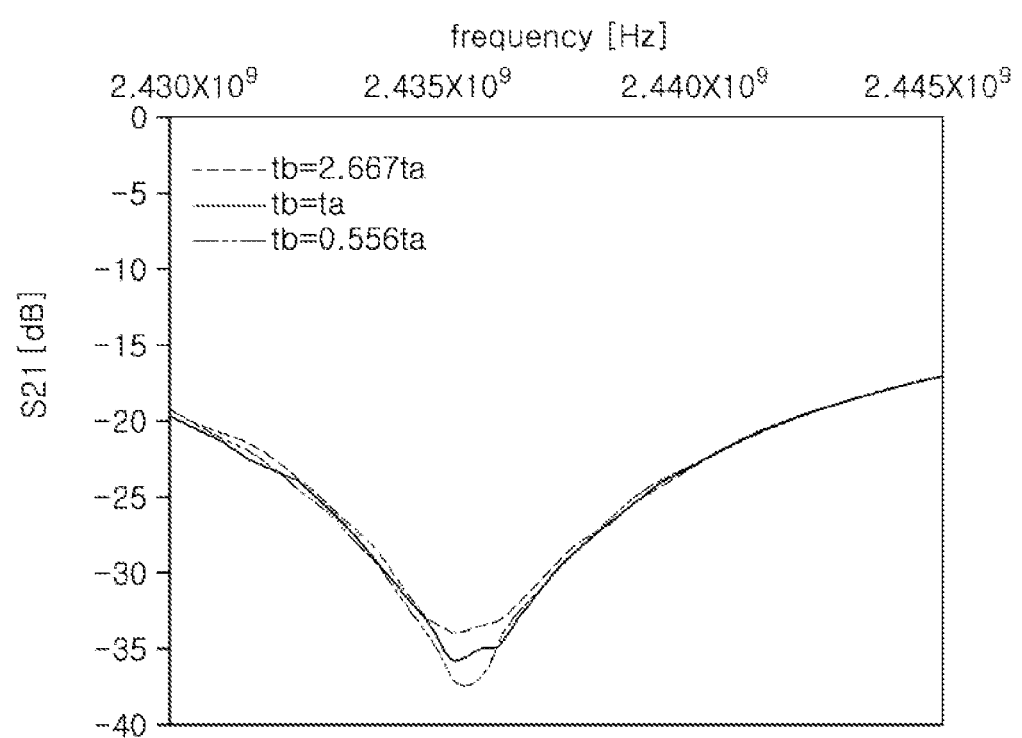
FIGS. 10 and 11 are graphs respectively illustrating voltage pass characteristics of an acoustic resonator according to an embodiment and an acoustic resonator according to related art.
Figure 11:
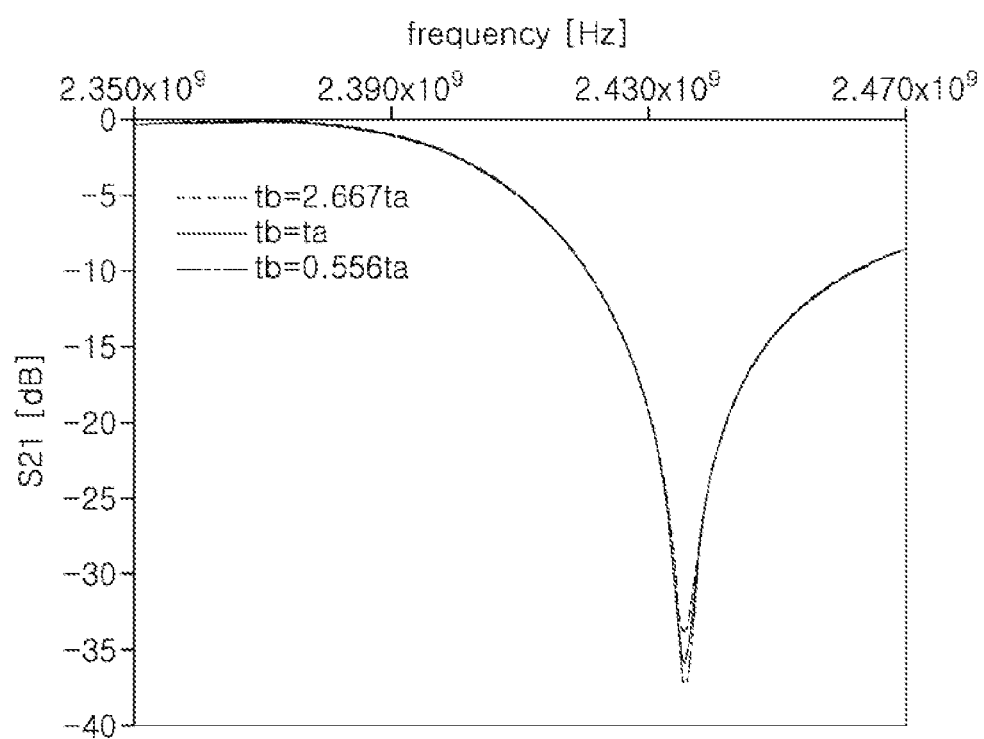

Referring to FIGS. 10 and 11, it can be easily recognized that the effect of preventing the leakage of the acoustic waves is accomplished by forming the connection electrode 30 at the thickness ta less than that of the electrode 11 or 13 on which the frame part 20 is formed, as described above. In FIGS. 10 and 11 illustrates comparison results of cases in which the connection electrode 30 has a thickness ta that is 2.667 times larger than the thickness tb of the electrode of the resonance part 10 on which the frame part 20 is formed, the connection electrode 30 has a thickness ta that is the same as the thickness tb of the electrode of the resonance part 10 on which the frame part 20 is formed, and the connection electrode 30 has a thickness ta that is 0.556 times smaller than the thickness tb of the electrode of the resonance part 10 on which the frame part 20 is formed.

As seen in graphs of FIGS. 10 and 11, it can be appreciated that attenuation performance is improved in a case in which the connection electrode 30 has a thickness ta that is less than the thickness of the electrode of the resonance part 10 on which the frame part 20 is formed (FIG. 10) compared to a typical acoustic resonator where such relationships between such a connection electrode and an electrode of a corresponding resonance part are not considered and where the connection electrode has a same or greater thickness than an electrode of the resonance part (FIG. 11). In other words, in the acoustic resonator 1, according to an embodiment, the thickness ta of the connection electrode 30 may be less than half of the thickness tb of the electrode of the resonance part 10 on which the frame part 20 is formed.

To improve the attenuation performance, it may be advantageous to form the connection electrode 30 to be as thin as possible. However, if the connection electrode is too thin, insertion loss may be increased due to an increase in a resistance of the connection electrode 30. Therefore, the connection electrode 30 may be formed at a thickness that is less than that of the electrode of the resonance part 10 on which the frame part 20 is formed, and that does not increase the insertion loss. In other words, in the acoustic resonator 1, according to an embodiment, the thickness ta of the connection electrode 30 may have a thickness that is greater than 1,000 Å.

Figure 2:
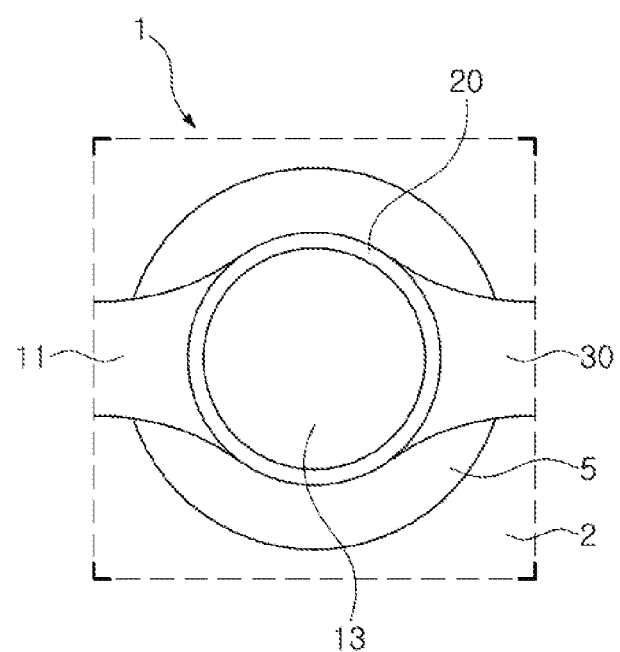
FIG. 2 is a plan view illustrating an acoustic resonator, according to an embodiment.

FIG. 2 is a plan view illustrating the acoustic resonator 1, according to an embodiment. Referring to FIG. 2, the frame part 20 may be continuously formed along the circumference of the area of the electrode 11 or 13 corresponding to the recess 3 to prevent the loss of the acoustic waves generated in the resonance part 10. In other words, the frame part 20 may be provided in a continuous shape along the circumference of the area of the electrode 11 or 13 corresponding to the recess 3. For example, the frame part 20 may have an annular shape.

As described above, the frame part 20 may be formed in the continuous shape to close the electrode 11 or 13, thereby preventing, minimizing, or mitigating the loss of the acoustic waves. Paths through which the acoustic waves are leaked may be blocked in all directions on a surface of the electrode 11 or 13.

Figure 3:
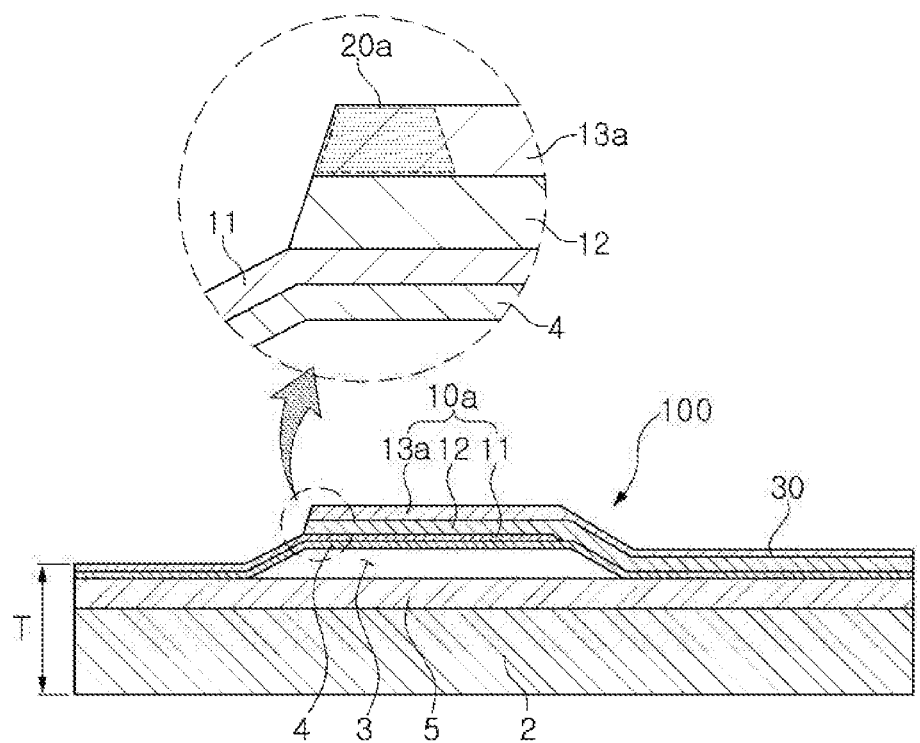
FIG. 3 is a cross-sectional view illustrating a frame part of an acoustic resonator, according to an embodiment.

FIG. 3 is a cross-sectional view illustrating a frame part 20a of an acoustic resonator 100, according to an embodiment. Referring to FIG. 3, the frame part 20a may be formed of a material having a property different from that of the electrode e.g., the electrode 13a) of the resonance part 10a on/in which the frame part 20a is provided or be reformed to have a property different from that of the electrode 13a, thereby reflecting the acoustic waves. In other words, the frame part 20a may be formed of the material having the property different from that of the electrode 13a, and may be provided along the circumference of an area of the electrode 13a corresponding to the recess 3. As shown in FIG. 3, for example, the frame part 20a may be formed in the electrode 13a, at an outer circumference of the electrode 13a. Alternatively, the frame part 20a may be formed to be connected to the electrode 13a at the outer circumference of the electrode 13a. The frame part 20a may, for example, have a same height in the thickness direction T as the electrode 13a.

Alternatively, the frame part 20a, according to an embodiment, may be formed of the same material as the material of the electrode 13a, but may be reformed to change, or generated to have, a physical property in the frame part 20a to be different than the physical property in the electrode 13a. For example, by the frame part 20a having a different or reformed material in comparison to the electrode 13a, a density, an elastic modulus, and/or the like of the frame part 20a may be different from a density, an elastic modulus, and/or the like of the electrode 13a.

As described above, the frame part 20a may be formed of the material different from that of the electrode (e.g., the electrode 13a) of the resonance part 10a, or may be reformed to have the physical property different from the physical property in the electrode of the resonance part 10a, thereby reflecting the acoustic waves. The different material or reformed material of the frame part 20a changes a transfer environment of the acoustic waves in the frame part 20a from a transfer environment of the acoustic waves in the electrode 13a of the resonance part 10a.

More specifically, because the frame part 20a is formed from a different material or a reformed material in comparison to the electrode of the resonance part 10a, physical properties of the frame part 20a, such as density, an elastic modulus, and the like, associated with the transfer of the acoustic waves are changed from those of the electrode of the resonance part 10a. Therefore, the frame part 20 may reflect the acoustic waves.

Although FIG. 2 shows the frame part 20a formed in/on the second electrode 13a, in another embodiment, the frame part 20a may be formed in/on the first electrode 11, depending on arrangements of the first electrode 11 and the second electrode 13a.

FIGS. 4 through 7 are cross-sectional views illustrating a method of manufacturing an acoustic resonator, such as the acoustic resonator 1 or 100, according to another embodiment. Referring to FIGS. 4 through 7, the method of manufacturing an acoustic resonator 1 may include, for example: forming the resonance part 10 on the substrate 2, the resonance part 10 and the substrate 2 having a sacrificial layer 3*a* partially formed therebetween; forming the frame part 20 on at least one electrode (e.g., the electrode 11 or 13) of the resonance part 10; forming the connection electrode 30 connecting the electrode 11 or 13 on which the frame part 20 is formed and the external electrode to each other, such that the connection electrode 30 has the thickness to less than a thickness tb of the electrode 11 or 13 of the resonance part 10 on which the frame part 20 is formed; and forming the recess 3 by removing the sacrificial layer 3*a* formed between the substrate 2 and the resonance part 10.

Figure 4:
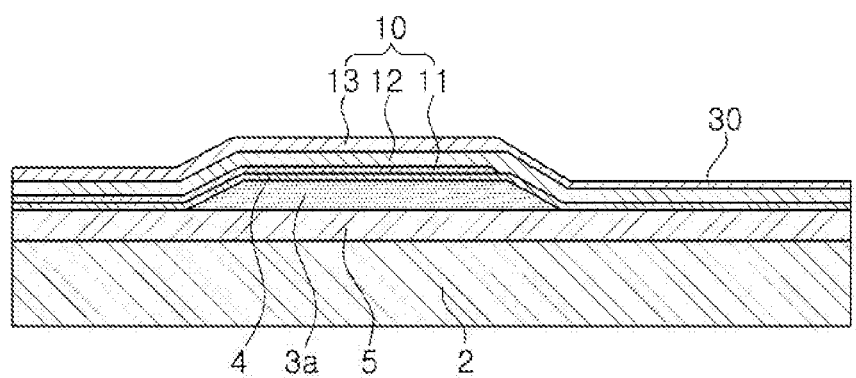
FIGS. 4 through 7 are cross-sectional views illustrating a method of manufacturing an acoustic resonator, according to an embodiment.

In the forming of the resonance part 10, the first electrode 11, the piezoelectric body 12, the second electrode 13, and the like, of the resonance part 10 may be stacked on the substrate 2 as illustrated in FIG. 4. The sacrificial layer 3*a* may be partially formed between the substrate 2 and the first electrode 11 of the resonance part 10 in order to form the recess 3 between the substrate 2 and the first electrode 11. In other words, the sacrificial layer 3*a* may be formed on the substrate 2. The sacrificial layer 3*a* may include silicon dioxide, polysilicon, polymer, or the like. However, other suitable materials may be used. The sacrificial layer 3*a* may be removed later through an etching process to form the recess 3.

After forming the sacrificial layer 3*a*, the first electrode 11, the piezoelectric body 12, and the second electrode 13 may be sequentially formed on the substrate 2 or the sacrificial layer 3*a*. The stop layer 5, the membrane layer 4, and the like may be formed, for example, before the first electrode 11 is formed.

The first electrode 11 may be formed by depositing a conductive layer on the substrate 2 and the sacrificial layer 3*a*. Likewise, the piezoelectric body 12 may be formed by depositing a piezoelectric material on the first electrode 11.

In addition, the first electrode 11 may be formed of various metals such as, but not limited to, gold (Au), molybdenum (Mo), ruthenium (Ru), aluminum (Al), platinum (Pt), titanium (Ti), tungsten (W), palladium (Pd), chromium (Cr), nickel (Ni), iridium (Ir), and the like.

The piezoelectric body 12 may be formed of various piezoelectric materials such as, but not limited to, aluminum nitride (AlN), zinc oxide (ZnO), silicon dioxide ($SiO_2$), doped zinc oxide (for example, W—ZnO), doped aluminum nitride (for example, Sc—AlN, MgZr—AlN, Cr—AlN, Er—AlN, Y—AlN), and the like.

The first electrode 11 and the piezoelectric body 12 may be formed in desired patterns by performing patterning through a photolithography process and then removing unnecessary portions using a patterned photo-resist as a mask. Through this process, the piezoelectric body 12 may remain only on the first electrode 11, such that the first electrode 11 may be formed to further protrude to areas surrounding the piezoelectric body 12.

The second electrode 13 may be formed in a desired pattern by forming a conductive layer on the piezoelectric body 12 and the first electrode 11, patterning the conductive layer through a photolithography process, and then using a photo-resist as a mask.

The second electrode 13 may be formed of various metals such as, but not limited to, gold (Au), molybdenum (Mo), ruthenium (Ru), aluminum (Al), platinum (Pt), titanium (Ti), tungsten (W), palladium (Pd), chromium (Cr), nickel (Ni), iridium (Ir), and the like.

Also, a protection layer may be formed on the second electrode 13 and the piezoelectric body 12. The protection layer may be formed of an insulating material. The insulating material may include a silicon oxide based material, for example a silicon nitride based material, and an aluminum nitride based material.

Figure 5A:
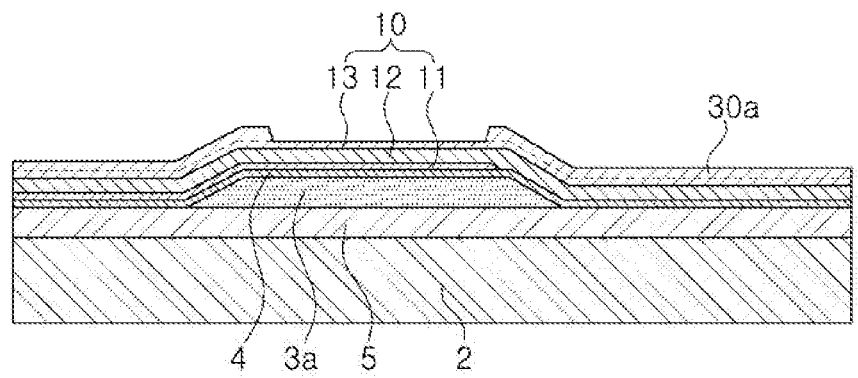
Figure 5B:
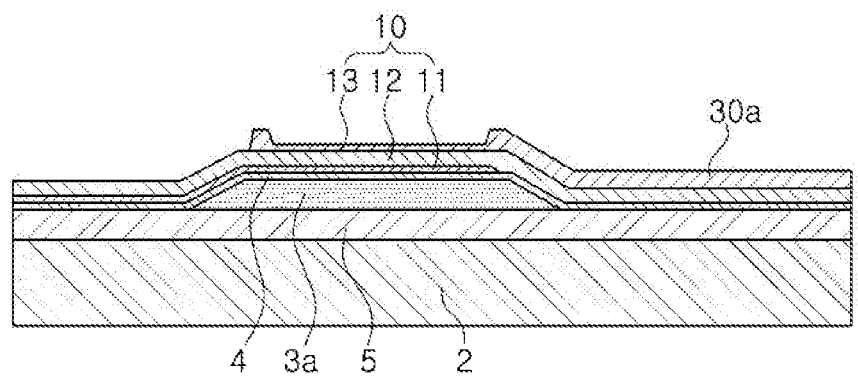

Referring to FIGS. 5A and 5B, the frame part 20 may be formed on at least one of the electrodes of the resonance part 10. More specifically, for example, the frame part 20 may be formed by depositing a material for forming the frame part 20 on the electrode 11 or 13 of the resonance part 10. As described above, the frame part 20 may be formed on the first electrode 11 or the second electrode 13 in the protruding shape, and may be formed of the same material as that of the first electrode 11 or the second electrode 13. In particular, the frame part 20 may be formed to be symmetrical on the electrode 11 or 13 to prevent the loss of the acoustic waves generated in the resonance part 10. The frame part 20 may be formed as a desired pattern by depositing a material for forming the frame part 20 on the electrode 11 or 13 and then performing a photolithography process. A process of depositing the material for forming the frame part 20 is illustrated in FIG. 5A, and the frame part 20 formed so that only a desired pattern of the frame part 20 remains is illustrated in FIG. 5B.

Figure 6:
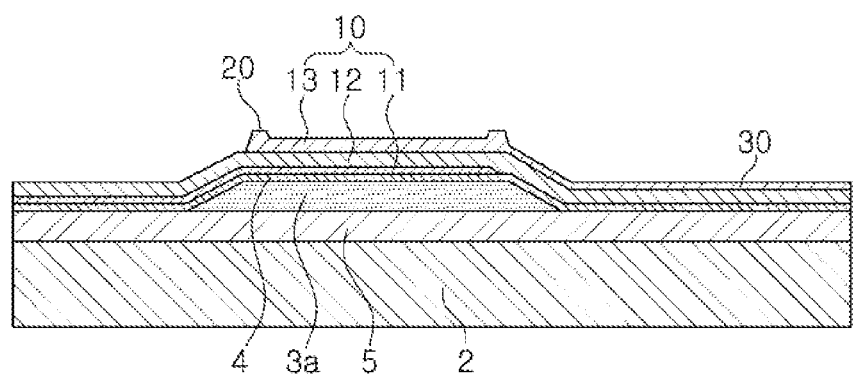

As illustrated in FIG. 6, the connection electrode 30 may be formed to connect the electrode 11 or 13 on which the frame part 20 is formed and the external electrode to each other. In particular, the connection electrode 30 may be formed at the thickness to less than of the thickness tb of the electrode 11 or 13 on which the frame part 20 is formed, thereby preventing, minimizing, or mitigating lack of symmetry of the frame part 20.

In more detail, as illustrated in FIG. 5A, the forming of the connection electrode 30 in a method of manufacturing an acoustic resonator 1, according to an embodiment, may include: forming a connection layer 30*a*, simultaneously with forming the electrode 11 or 13 on which the frame part 20 is formed, to be connected to the electrode 11 or 13 on which the frame part 20 is formed; and etching the connection layer 30*a* at a thickness less than the thickness tb of the electrode 11 or 13 on which the frame part 20 is formed. In other words, as an example of forming the connection electrode 30, the connection electrode 30 may be formed at a target thickness ta by forming the connection layer 30*a* at a thickness thicker than the target thickness ta and then etching the connection layer 30*a* to the target thickness ta. However, the forming of the connection electrode 30 is not limited to the preceding example, and additional examples of forming the connection electrode 30 will be described below with reference to FIGS. 8A through 9B.

In addition, the connection parts that may be used for frequency trimming may formed after the forming of the connection electrode 30. The connection parts may be formed by externally exposing the connection electrode 30, which is connected to the first electrode 11 or the second electrode 13, through holes or vias formed by partially removing a protection layer covering the connection electrode 30 through etching, and then depositing a conductive material such as gold (Au), copper (Cu), or the like, on the connection electrode 30 using the through holes or vias.

Figure 7:
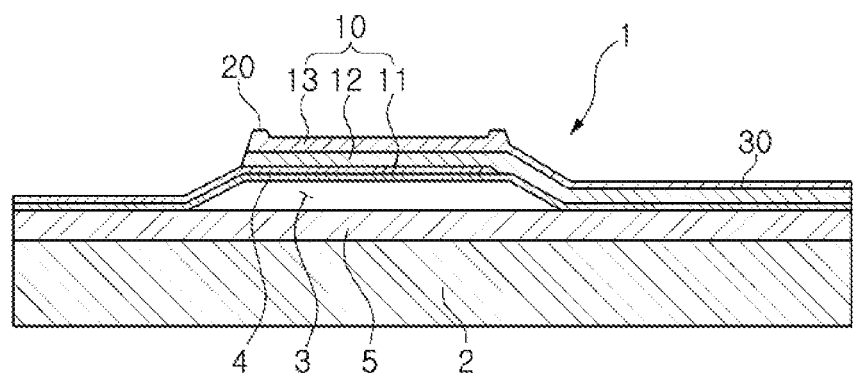

As shown in FIG. 7, the recess 3 may be formed by removing the sacrificial layer 3*a*. To this end, in detail, the sacrificial layer 3*a* may be removed through dry etching, but is not necessarily limited thereto. For example, in a case in which the sacrificial layer 3a is formed of polysilicon, the sacrificial layer 3a may be removed through gas for dry etching, such as xenon difluoride ($XeF_2$).

FIGS. 8A through 9B are cross-sectional views illustrating examples of a process of forming a connection electrode 30 in the method of manufacturing an acoustic resonator 1, according another embodiment.

Figure 8A:
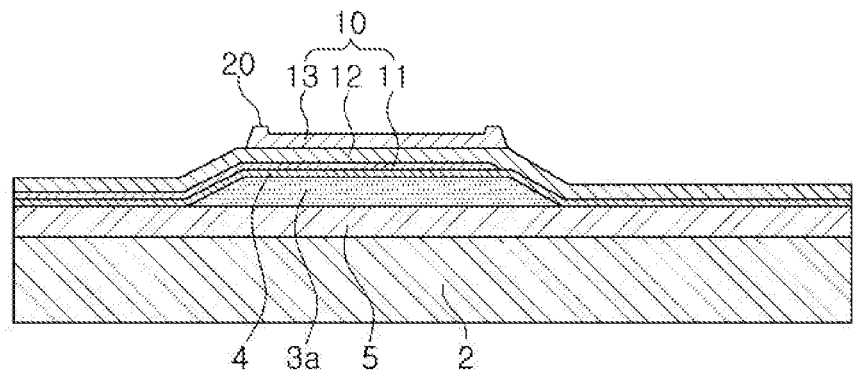
FIGS. 8A through 9B are cross-sectional views illustrating examples of a process of forming a connection electrode in a method of manufacturing an acoustic resonator, according to an embodiment.
Figure 8B:
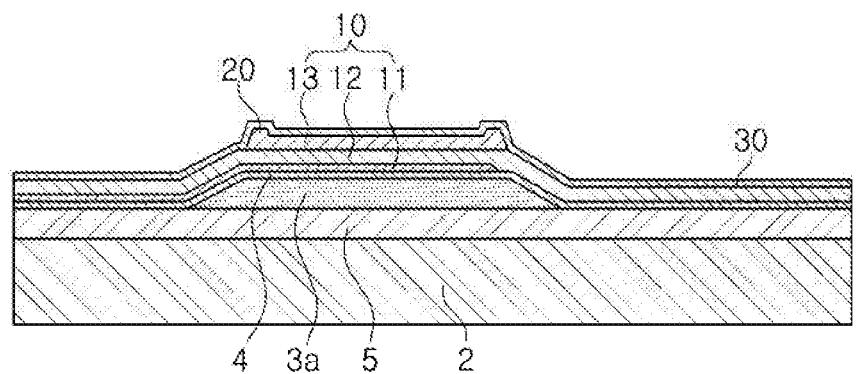

First, referring to FIGS. 8A and 8B, according to an embodiment, the connection electrode 30 may be deposited to cover the electrode 11 or 13 of the resonance part 10 on which the frame part 20 is formed and which is formed in the area corresponding to the recess 3, and may be deposited at a constant thickness ta up to an area connected to the external electrode 11 or 13. In other words, when the electrode 11 or 13 on which the frame part 20 is formed is provided as illustrated in FIG. 8A, a material for forming the connection electrode 30 may be deposited at the same thickness ta up to the area connected to the external electrode while covering the electrode 11 or 13, thereby forming the connection electrode 30, as illustrated in FIG. 8B.

When the connection electrode 30 is formed as described above, the material for forming the connection electrode 30 may be the same as that of the electrode 11 or 13. That is, a portion of material for forming the connection electrode 30 that has been deposited on the electrode of the resonance part 10 may ultimately become a portion of the electrode. Therefore, the thickness tb of the electrode of the resonance part 10 may be thicker than the thickness to of the connection electrode 30. The connection electrode 30 that is additionally deposited may be additionally patterned at a shape of the resonance part 10 to have a shape as illustrated in FIG. 1.

Figure 9A:
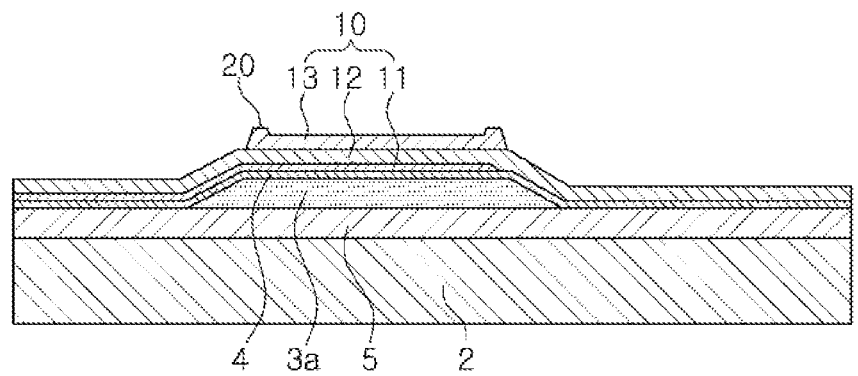
Figure 9B:
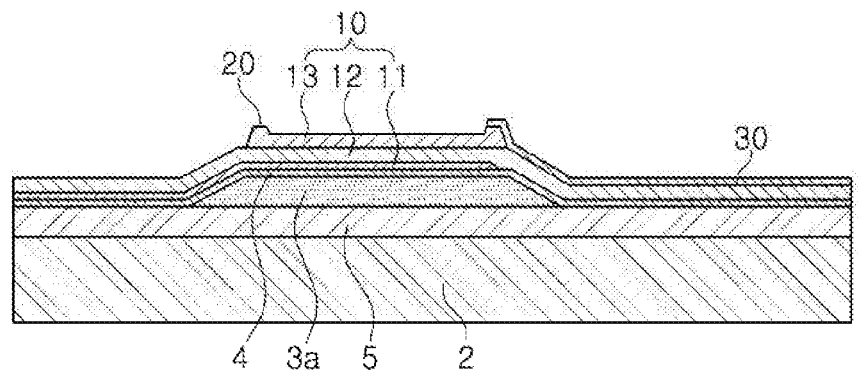

Referring to FIGS. 9A and 9B, in the forming of the connection electrode 30 of the method of manufacturing an acoustic resonator 1 according to another exemplary embodiment in the present disclosure, the connection electrode 30 may be deposited to be connected to the electrode of the resonance part 10 on which the frame part 20 is formed and which is formed in the area corresponding to the recess 3, and may be formed of a material different from that of the electrode of the resonance part 10 on which the frame part 20 is formed.

In other words, when the electrode 11 or 13 of the resonance part 10 on which the frame part 20 is formed is provided as illustrated in FIG. 9A, a material for forming the connection electrode 30 may be deposited and only formed on an area connecting an end portion of the electrode 11 or 13 and the external electrode 30 to each other, and may not be deposited on other portions of the electrode 11 or 13, as illustrated in FIG. 9B. In particular, the material for forming the connection electrode 30 may be different from a material of the electrode of the resonance part 10, whereby the symmetry of the frame part 20 formed on the electrode of the resonance part 10 may not be reduced.

As set forth above, in the acoustic resonators according to the disclosed embodiments, the influence of the connection electrode on the reduction in the symmetry of the frame part may be decreased. Therefore, the loss of the resonant acoustic waves reflected by the frame part may be reduced, and performance of the acoustic resonator may be improved.

In addition, in a method of manufacturing an acoustic resonator, according to embodiments disclosed herein, the acoustic resonator may be easily manufactured to minimize a reduction in symmetry of the frame part.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An acoustic resonator comprising:
    a substrate;
    a resonance part mounted on the substrate and comprising resonance part electrodes, the resonance part being configured to generate acoustic waves;
    a cavity disposed between the resonance part and the substrate;
    a frame part disposed on at least one electrode among the resonance part electrodes, and being configured to reflect the acoustic waves; and
    a connection electrode configured to connect the at least one electrode to an external electrode, and having a thickness less than a thickness of the at least one electrode.

2. The acoustic resonator of claim 1, wherein the thickness of the connection electrode is less than half of the thickness of the at least one electrode.

3. The acoustic resonator of claim 1, wherein the thickness of the connection electrode is greater than 1,000 Å.

4. The acoustic resonator of claim 1, wherein the frame part comprises a symmetrical shape in an area on the at least one electrode corresponding to the cavity.

5. The acoustic resonator of claim 1, wherein the frame part comprises a continuous shape along a circumference of an area on the at least one electrode corresponding to the cavity.

6. The acoustic resonator of claim 1, wherein the frame part protrudes from the at least one electrode along a circumference of an area on the at least one electrode corresponding to the cavity.

7. The acoustic resonator of claim 1, wherein the frame part is formed of a material having a property different from a property of the at least one electrode.

8. The acoustic resonator of claim 1, wherein:
    the frame part is formed of a material that is same as a material of the at least one electrode, and that is caused to have a property different from a property of the at least one electrode; and
    the frame part is disposed along a circumference of an area of the at least one electrode corresponding to the cavity.

9. The acoustic resonator of claim 1, wherein:
    the resonance part further comprises a piezoelectric body; and
    the resonance part electrodes comprise
        a first electrode disposed on the substrate so as to form the cavity between the first electrode and the substrate, and contacting a first surface of the piezoelectric body, and a second electrode contacting a second surface of the piezoelectric body and having the frame part disposed thereon.

10. An acoustic resonator comprising:

a substrate;

a resonance part mounted on the substrate, the resonance part comprising resonance part electrodes and a piezoelectric body configured to generate acoustic waves;

a cavity disposed between the resonance part and the substrate;

a frame part disposed on a first electrode among the resonance part electrodes, at an outer circumference of the first electrode with respect to extents of the cavity, and being configured to reflect the acoustic waves; and a connection electrode connected to the at least one electrode and configured to be connected to an external electrode, the connection electrode comprising a thickness less than a thickness of the first electrode.

11. The acoustic resonator of claim 10, wherein the frame part protrudes from the first electrode in a thickness direction of the acoustic resonator.

12. The acoustic resonator of claim 10, wherein the frame part comprises an annular shape.

13. The acoustic resonator of claim 10, wherein a density or an elastic modulus of a material of the frame part is different than a density or an elastic modulus, respectively, of a material of the first electrode.

14. An acoustic resonator comprising:

a substrate;

a resonance part mounted on the substrate and comprising resonance part electrodes, the resonance part being configured to generate acoustic waves;

a cavity disposed between the resonance part and the substrate;

a frame part disposed on at least one electrode among the resonance part electrodes, and being configured to reflect the acoustic waves; and a connection electrode configured to connect the at least one electrode to an external electrode, the connection electrode having a thickness less than half of a thickness of the first electrode and at least 1,000 Å.

15. The acoustic resonator of claim 14, wherein the connection electrode comprises a material that is different than a material of the at least one electrode.

16. The acoustic resonator of claim 14, wherein a density or an elastic modulus of a material of the frame part is different than a density or an elastic modulus, respectively, of a material of the first electrode.

* * * * *